(12) United States Patent
Matsumoto et al.

(10) Patent No.: US 6,730,938 B2
(45) Date of Patent: May 4, 2004

(54) SEMICONDUCTOR LIGHT EMITTING DEVICE AND METHOD FOR MANUFACTURING THE SAME

(75) Inventors: Yukio Matsumoto, Kyoto (JP); Tadahiro Hosomi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/134,485

(22) Filed: Apr. 30, 2002

(65) Prior Publication Data

US 2002/0163007 A1 Nov. 7, 2002

(30) Foreign Application Priority Data

May 1, 2001 (JP) ........................... 2001-133919

(51) Int. Cl.[7] .................. H01L 29/06; H01L 33/00; H01L 21/00; H01S 5/00
(52) U.S. Cl. ................. 257/96; 98/99; 98/103; 98/12; 98/13; 98/14; 438/22; 438/46; 438/47; 372/45; 372/46
(58) Field of Search ................... 257/96, 98, 99, 257/103, 12, 13, 14, 22, 79; 438/22, 46, 47, 956; 372/43, 45, 46

(56) References Cited

U.S. PATENT DOCUMENTS 5,789,768 A * 8/1998 Lee et al. ................. 257/96

* cited by examiner

*Primary Examiner*—Kang Donghee
(74) *Attorney, Agent, or Firm*—Rabin & Berdo, P.C.

(57) ABSTRACT

On a semiconductor substrate (1), there are laminated a light emitting layer forming portion (11) having at least an n-type layer (3) and a p-type layer (5) and a window layer (6), and a semiconductor laminating portion (12) is formed. On a surface thereof, a step free current blocking layer (10) is partially provided, so that a surface of the current blocking layer and the surface of the semiconductor laminating portion are flat. An upper electrode (8) is formed thereon in an area larger than that of the current blocking layer (10), and a lower electrode (9) is provided on a back surface of the semiconductor substrate (1). As a result, there can be provided a semiconductor light emitting device with structure such that there is no need to place an etching process in the middle of an epitaxial growth process, and the reliability of electrode can be improved without a step being produced at a portion at which the upper electrode is formed and a method thereof.

7 Claims, 3 Drawing Sheets

US 6,730,938 B2

SEMICONDUCTOR LIGHT EMITTING DEVICE AND METHOD FOR MANUFACTURING THE SAME

FIELD OF THE INVENTION

The present invention relates to a semiconductor light emitting device structured to acquire a light at the surface side of a light emitting layer forming portion at which a semiconductor layer is laminated to form a light emitting layer. More particularly, the present invention relates to a semiconductor light emitting device structured to enable reduction of an effect of light interruption caused by an upper electrode and improvement of acquisition efficiency (external differential quantum efficiency) of the emitting light to the outside.

BACKGROUND OF THE INVENTION

In a semiconductor light emitting device structured so that an upper electrode is provided on the surface of a semiconductor laminating portion and a light is emitted from the upper side thereof, the light is interrupted at the upper electrode thereof, and the light cannot be efficiently acquired. Moreover, a current flows from the upper electrode to a lower electrode, and thus, the current particularly concentrates at the lower side of the upper electrode, causing strong light emission at the lower side of the upper electrode. Therefore, there is a problem that the strongly emitted light cannot be efficiently acquired, the light at the outer periphery of a chip with its weak light emission is acquired without being interrupted by the electrode, and an acquisition ratio relevant to light emission quantity (external differential quantum efficiency) is low. In order to solve such a problem, for example, as shown in FIGS. 3A to 3C, a design is made such that a current is oriented from the upper electrode to the outer periphery without flowing such current to the lower side of the upper electrode.

In a structure shown in FIG. 3A, on a semiconductor substrate 21 consisting of an n-type GaAs, for example, there are epitaxially grown: an n-type clad layer 22 made of an n-type InGaAlP based semiconductor material; an active layer 23 consisting of an InGaAlP based semiconductor material with its constitution such than its band gap energy is lower than that of the clad layer; and a p-type clad layer 24 consisting of a p-type InGaAlP based semiconductor material, respectively, and a light emitting layer forming portion 29 with its double-hetero structure is formed. Then, at a portion corresponding to an upper electrode thereon, an insulating layer 30 such as $SiO_2$ is interposed, and further, on its surface, a p-type window layer (current diffusion layer) 25 consisting of an AlGaAs based compound semiconductor is provided. At the center of its surface, an upper (p-side) electrode 27 is formed at a portion equivalent to the top of the previously described insulation layer 30, and a lower (n-side) electrode 28 is formed on the back surface of the semiconductor substrate. A contact layer consisting of GaAs or the like may be provided beneath the upper electrode 27.

In addition, in a structure shown in FIG. 3B, the previously described insulation layer 30 is provided in the middle of a window layer 25, and the other elements are structurally the same as those of FIG. 3A. Further, in a structure shown in FIG. 3C, the insulation layer is provided on the window layer 25, and the upper electrode 27 is formed so as to cover the insulating layer 30.

In the structures shown in FIGS. 3A and 3B described previously, a growing process is interrupted in the middle of epitaxial growth, and an etching process for forming an insulating layer must be incorporated. Therefore, there is a problem that the process becomes complicated and impurities is mixed during growth of the semiconductor layer, which causes contamination to occur easily. Further, even if the semiconductor layer is grown to be thick, there is a problem that a protrusion corresponding to the insulating layer is produced on the surface of the laminated semiconductor layer, and adhesion of the electrode deteriorates.

On the other hand, in the structure shown in FIG. 3C, there is no need to place the etching process in the middle of epitaxial growth. However, there easily occurs a problem that the upper electrode portion is exposed due to a shock or the like caused by wire bonding with the electrode for reasons such as the presence of a step of the upper electrode between portions at which the insulating layer is present and absent, and over-etching easily occurs up to the semiconductor layer when the insulating layer 30 under the upper electrode 27 is patterned.

SUMMARY OF THE INVENTION

The present invention has been made in order to solve the foregoing problem. It is an object of the present invention to provide a semiconductor light emitting device with its structure in which there is no need to place an etching process in the middle of an epitaxial growth process, and light emission efficiency can be improved without current flowing to the lower side of the upper electrode while the reliability of electrode is improved without causing a step to be produced at a portion at which the upper electrode is formed.

It is another object of the present invention to provide a method for manufacturing a semiconductor light emitting device capable of forming a current blocking layer with its simple production process, and moreover, in a flat state in which no step is produced on the surface.

A semiconductor light emitting device according to the present invention includes: a semiconductor substrate; a semiconductor laminating portion provided on the semiconductor substrate, and containing a light emitting layer forming portion having at least an n-type layer and a p-type layer and a window layer; an upper electrode partially provided on the semiconductor laminating portion; a lower electrode provided on the back surface of the semiconductor substrate, and a current blocking layer which is provided on a part of a surface of the semiconductor laminating portion beneath the upper electrode, wherein a surface of the current blocking layer and the surface of the semiconductor laminating portion are flat without a step.

With this structure, a site at which the upper electrode is formed is flat, and the reliability of adhesion of the upper electrode is extremely improved. In addition, there is no need to place an etching process in the middle of the epitaxial growth process, and the production process is extremely simplified. Moreover, a current blocking layer is provided immediately underneath the upper electrode. Thus, a current naturally flows the outer periphery side of the chip and does not flow the lower side of the upper electrode, so that the current can be extended to the entire chip.

The above-mentioned current blocking layer is formed of an electrically conductivity type layer which is different from an electrically conductivity type of a semiconductor layer of the surface of the semiconductor laminating portion or a high resistance layer caused by a crystalline defect.

A method for manufacturing a semiconductor light emitting device according to the present invention includes the steps of: growing a semiconductor laminating portion containing a light emitting layer forming portion having at least an n-type layer and a p-type layer and a window layer on a semiconductor substrate; providing a mask layer on the semiconductor laminating portion; etching the mask layer at a portion corresponding to a position at which an upper electrode is formed, thereby exposing a surface of the semiconductor laminating portion; carrying out a heat treatment under hydrogen atmosphere, thereby evaporating an element that constitutes a semiconductor layer of the surface of the semiconductor laminating portion exposed from the mask layer and producing a crystalline defect; removing only the mask layer; and forming an upper electrode at a site at which the crystalline defect is produced, in size which is greater than that of the site. It is noted that a mask layer may be formed by continuously growing a semiconductor layer or can be formed of an insulating layer such as $SiO_2$.

Another aspect of a method for manufacturing a semiconductor light emitting device according to the present invention includes the steps of: growing a semiconductor laminating portion containing a light emitting layer forming portion having at least an n-type layer and a p-type layer and a window layer on a semiconductor substrate; forming a current blocking layer by changing partially a semiconductor layer of a surface of the semiconductor laminating portion to a different conductivity type region or an insulating region at a portion on which an upper electrode is formed, by a predetermined depth from the surface; and forming the upper electrode on the surface of the semiconductor laminating portion having the current blocking layer in size which is greater than that of the current blocking layer.

DETAILED DESCRIPTION OF THE INVENTION

Figure 1A:
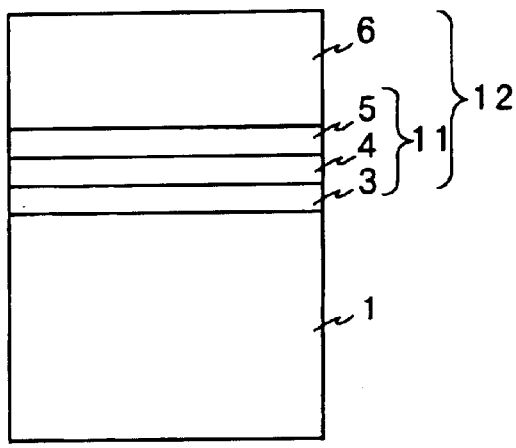
FIGS. 1A to 1D are illustrative views each illustrating a process of manufacturing an LED chip according to one embodiment of the present invention.

Hereinafter, a semiconductor light emitting device and a method thereof according to the present invention will be described with reference to the drawings. A semiconductor light emitting device according to the present invention, as shown in FIGS. 1D and 2D, respectively, includes a semiconductor laminating portion 12 containing a light emitting layer forming portion 11 having at least an n-type layer 3 and a p-type layer 5, and a window layer 6 laminated on a semiconductor substrate 1; a current blocking layer 10 being partially provided on a surface thereof beneath an upper electrode; and an upper electrode 8 being provided thereon in an area greater than that of the current blocking layer 10; and a lower electrode 9 being provided on the back surface of the semiconductor substrate 1. And a surface of the current blocking layer and the surface of the semiconductor laminating portion are flat without a step.

The light emitting layer forming portion 11 is formed by, for example, an n-type clad layer 3 made of $In_{0.49}(Ga_{1-x}Al_x)_{0.51}P$ ($0.5 \leq x \leq 1$, for example, x=0.7) being grown by about 0.5 to 2 $\mu$m; for example, an active layer 4 made of $In_{0.49}(Ga_{1-y}Al_y)_{0.51}P$ ($0 \leq y \leq 0.4$, for example, y=0.1) being grown by about 0.2 to 1 $\mu$m; and a p-type clad layer made of $In_{0.49}(Ga_{1-x}Al_x)_{0.51}P$ ($0.5 \leq x \leq 1$, for example, x=0.7) being grown by about 0.5 to 2 $\mu$m, respectively. As semiconductor layers constituting the light emitting layer forming portion 11, there can be used another light emission color semiconductor layers such as AlGaAs based compound semiconductor without limiting to such InGaAlP based compound semiconductor.

On the surface of this light emitting layer forming portion 11, a window layer 6 made of an AlGaAs based compound semiconductor is provided by 3 to 10 $\mu$m, and a semiconductor laminating portion 12 is formed. It is noted that in case where a protection layer with its small Al crystal mixture ratio may be provided on the surface of the window layer 6 or a semiconductor layer such as a contact layer made of GaAs or the like may be provided only at the lower side of the upper electrode, such a semiconductor layer is contained in this semiconductor laminating portion.

The semiconductor light emitting device of the present invention is characterized in that: a portion at which the upper electrode 8 is formed is produced as an electrically conductivity type different from that of a semiconductor layer of the top surface of the semiconductor laminating portion 12; or, As or P constituting such the semiconductor layer is evaporated, and a crystalline defect is produced and semi-insulated, whereby the current blocking layer 10 which blocks a current is formed on a part of the surface side of the semiconductor laminating layer portion 12. In the case where this current blocking layer 10 is formed of a different electrically conductivity type, as described later, a dummy electrode which its electrically conductivity type impurity is doped is formed, the dummy electrode can be removed after being diffused from the dummy electrode or introduced by ion implantation and diffused. In the case of making an insulating layer, as shown in FIGS. 2A to 2D described later, semi-insulating layer can be made by ion implantation such as proton in addition to evaporating a part of elements constituting the semiconductor layer.

An upper (p-side) electrode 8 covers the current blocking layer 10 with Au/Be-Ni or the like, for example, as shown in FIG. 1D, and is provided in an area which is greater than that of the current blocking layer 10. This upper electrode 8 may be formed by patterning after being fully provided. However, it is preferable to use a lift-off method for providing a mask other than a portion at which an electrode is provided, coating an electrode material over all, followed by removing the mask. By using lift-off method, the lower side of the electrode can be prevented from being over-etched. In addition, on the back surface of the semiconductor substrate 1 made of GaAs, for example, Au/Ge—Ni or the like is fully provided in thickness of about 1 to 2 $\mu$m, and an n-side electrode 9 is formed.

According to the semiconductor light emitting device of the present invention, at a portion at which an upper electrode is provided on the surface of a semiconductor laminating portion, there is provided a current blocking layer which blocks a current with a different electrically conductivity type layer or insulating layer without deteriorating surface flatness. Thus, the upper electrode provided so as to cover the current blocking layer is connected to the semiconductor layer with its good adhesion. On the other hand, during operation, no current flows to the current blocking layer from the upper electrode. Thus, a current flows to the semiconductor layer around the current blocking layer, and flows extensively around the chip. Such a current flows toward the lower (n-side) electrode provided on the back surface of the semiconductor substrate 1. However, the current does not flow immediately beneath the surface electrode because the current blocking layer exists. Light is particularly emitted in an active layer with double-hetero structure around the chip, and the light is irradiated all around. Therefore, an effect of shield caused the surface electrode is reduced, and the light acquisition efficiency relevant to the same input is improved.

Now, a method of producing this semiconductor light emitting device will be described with reference to FIGS. 1A to 1D. For example, an n-type GaAs substrate 1 is placed in an MOCVD (metal organic chemical vapor deposition) device. There are introduced required gases such as: triethyl gallium (TEG) or trumethyl gallium (TMG), arsin (AsH$_3$), trimethyl aluminum (TMA), or trimethyl indium (TMIn) as reaction gases; H$_2$Se as an n-type dopant; or dimethyl zinc (DMZn) as a p-type dopant in the case of forming a p-type layer, respectively. As shown in FIG. 1A, there are continuously grown: an n-type clad layer 3 consisting of $In_{0.49}(Ga_{0.3}Al_{0.7})_{0.51}P$ by about 0.5 to 2 μm; a non-doped active layer 4 consisting of $In_{0.49}(Ga_{0.75}Al_{0.25})_{0.51}P$ by about 0.2 to 1 μm; a p-type clad layer 5 consisting of $In_{0.49}(Ga_{0.3}Al_{0.7})_{0.51}P$ by about 0.5 to 2 μm; and, for example, a p-type window layer 6 consisting of $Al_{0.7}Ga_{0.3}As$ by 3 to 10 μm, respectively.

Figure 1B:
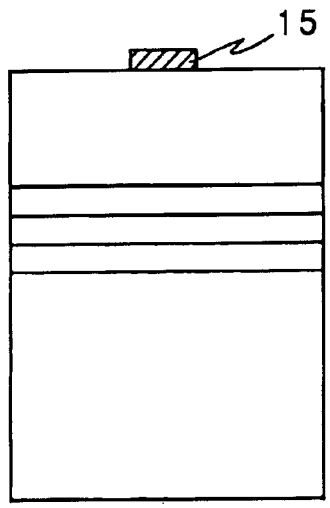

Then, as shown in FIG. 1B, at a site at which the upper electrode is formed, an n-type impurity doped n-type electrode (dummy electrode) 15 is formed by about 0.1 to 2 μm. Although this n-type electrode 15 is formed in accordance with the lift-off approach or mask evaporating approach, for example, patterning may be done in a photolithography process after a metal has been fully applied.

Figure 1C:
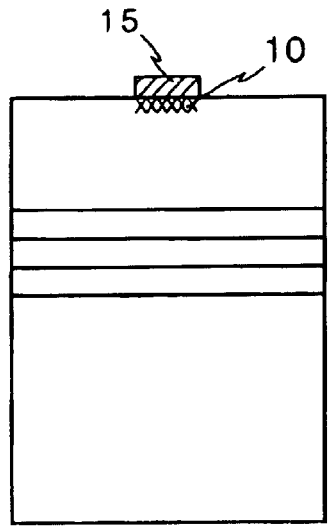
Figure 1D:
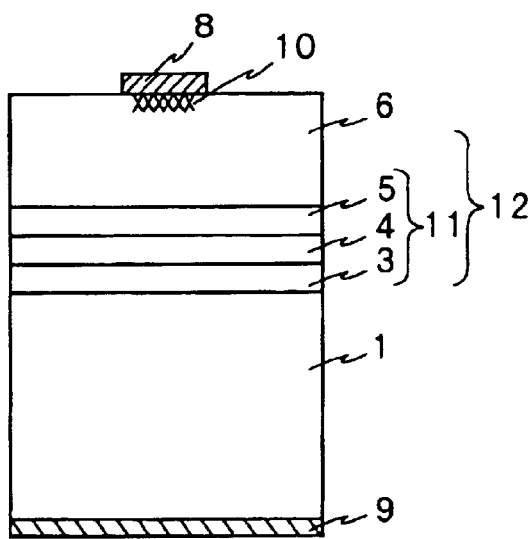

Then, for example, heat treatment is carried out at 350 to 500° C. and for about 15 minutes, for example, under N$_2$ atmosphere, whereby, as shown in FIG. 1C, the p-type window layer 6 and n-type electrode 15 are alloyed, and then, is n-typed up to a depth of about 0.2 μm, and the current blocking layer 10 is formed. Then, the n-type electrode is removed by polishing or etching. Then, Au/Be-Ni or the like is provided by the lift-off approach, mask evaporation, or patterning in accordance with the photolithography approach after full filming, and as shown in FIG. 1D, the intrinsic upper electrode 8 is formed.

In this example, in order to produce an n-type region for forming the current blocking layer 10, although the n-type electrode is formed and then, is formed by alloying with the semiconductor layer, an n-type impurities doped polysilicon film is provided and patterned, whereby diffusing may be carried out. Or impurities may be introduced to diffuse in accordance with an ion implantation approach by mask, or may be diffused using a diffusion furnace. By these methods, an n-type layer with its flat surface can be formed without affecting another portion.

By carrying out this method, an electrically conductivity type only at the lower side of the upper electrode changes, and a current blocking layer is produced. Therefore, the carrier concentration at another portion does not change, and the characteristics of light emitting devices do not change. Moreover, there is no need to place an etching process in the middle of epitaxial growth, a current blocking layer with its flat surface can be formed in its simple production process, a current can be extended around the chip without current flowing to the lower side of the surface electrode, and light emitting efficiency can be improved.

FIGS. 2A to 2D are illustrative views each illustrating another method for forming the current blocking layer 10.

In this example, the current blocking layer 10 is semi-insulated instead of being n-typed.

Figure 2A:
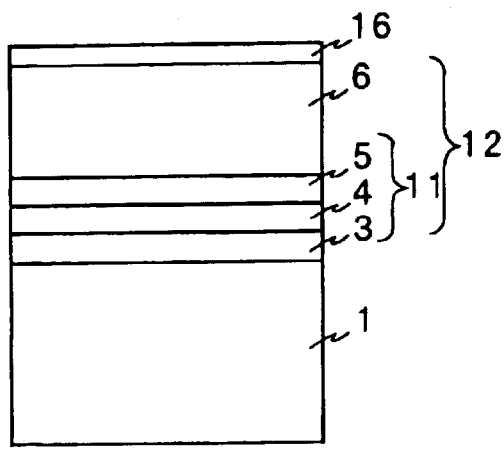
FIGS. 2A to 2D are illustrative views each illustrating a process of manufacturing an LED chip according to another embodiment of the present invention.

First, as shown in FIG. 2A, as in the previously described example, there are continuously grown: an n-type clad layer 3; a non-doped active layer 4; a p-type clad layer 5, and a p-type window layer 6 consisting of $Al_{0.7}Ga_{0.3}As$, for example, respectively. Further, a dummy semiconductor layer (mask layer) 16 consisting of a GaAs layer is continuously grown in thickness of 0.2 to 1 μm.

Figure 2B:
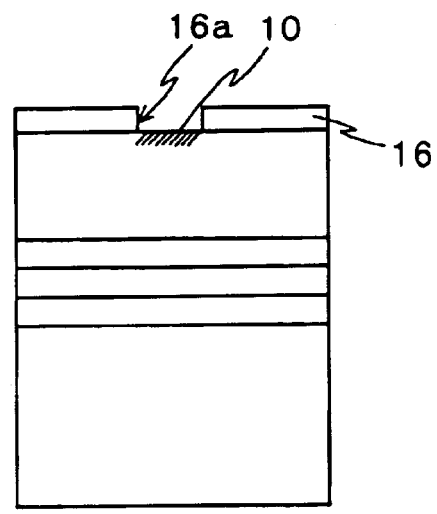

Then, as shown in FIG. 2B, at a position at which the upper electrode is formed the dummy semiconductor layer (mask layer) 16 is provided with an opening 16a being slightly smaller than the size of the upper electrode by etching, and the surface of the window layer 6 is exposed partially. This mask layer 16 may be an insulation layer such as SiO$_2$ instead of a semiconductor, or may be any mask capable of enduring high temperature. In the case of the semiconductor layer, by using a mask which has a large difference in etching rate between the surface of the window layer, an opening of the mask layer is easily formed and a mask layer is easily removed, whereby the mask layer 16 can be continuously formed using the same semiconductor layer growing device. Thereafter, a temperature is set to about 600 to 850° C. under the hydrogen atmosphere, whereby As evaporates at a surface portion of the window layer 6 exposed from the opening 16a of the mask layer 16, and a layer of a crystalline defect from which As of AlGsAs has been evaporated is produced, and property of the semiconductor is eliminated, and the layer becomes semi-insulated. As a result, such a portion functions as the current blocking layer 10.

Figure 2C:
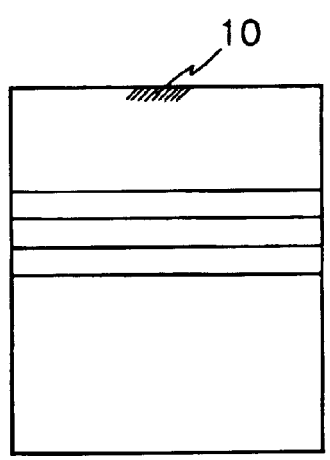
Figure 2D:
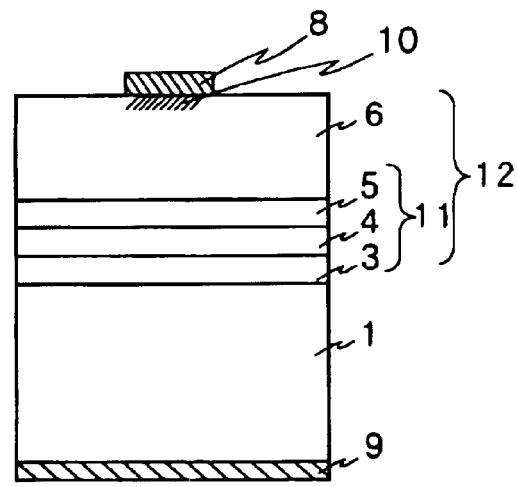
Figure 3A:
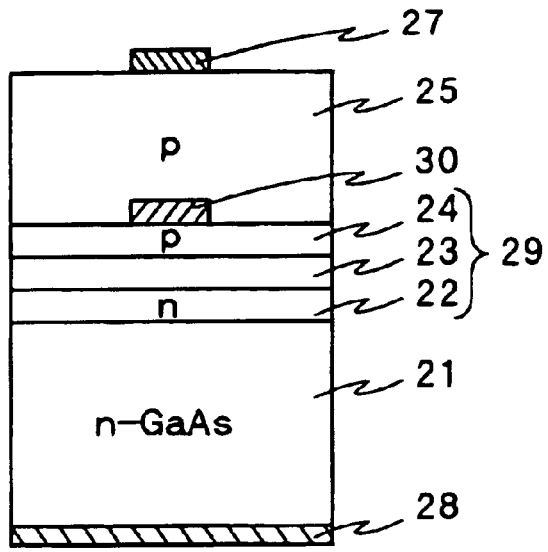
FIGS. 3A to 3C are illustrative cross sections each illustrating an exemplary structure of a conventional LED chip.
Figure 3B:
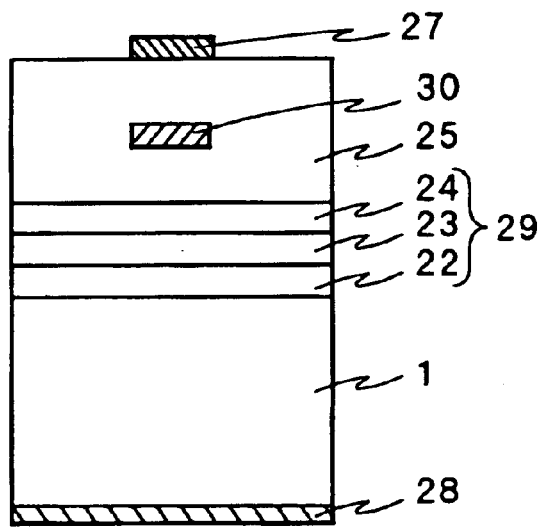
Figure 3C:
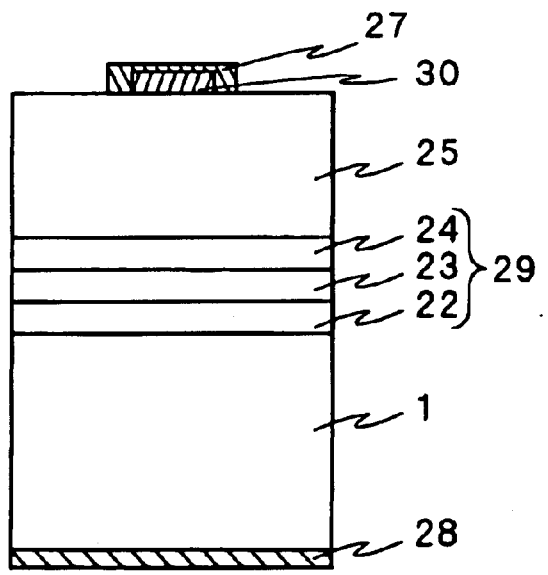

Next, as shown in FIG. 2C, the mask layer 16 is removed by etching. As a result, the current blocking layer 10 semi-insulated only at a portion at which an electrode is formed, is formed on a flat face, and is exposed to the surface. Then, as same in the previously described example, the current blocking layer 10 is covered, and the upper electrode 8 is formed so as to be enlarged therefrom, and the lower (n-side) electrode 9 is formed on the back surface of the semiconductor substrate 1 and is chipped, whereby an LED chip as shown in FIG. 2D can be obtained.

In this way, only a portion at which an electrode is formed is exposed, a mask is formed at the periphery thereof, and heat treatment is carried out, whereby As of the only exposed portion evaporates, evaporation is restricted by the mask at a portion at which the mask is provided, and the intrinsic crystalline structure can be maintained. As a result, only an exposed portion serves as the current blocking layer 10, any abnormality does not occur with another portion, and a current always flows a normal portion of this crystal. That is, the current blocking layer can be provided at the lower side of the upper electrode while flatness of the surface of the semiconductor laminating portion is maintained and without incorporating the etching process in the epitaxial growth process. Thus, wasteful light emission emitted at the lower side of the upper electrode and interrupted by the upper electrode is restricted as much as possible, and a ratio of light that can be acquired to the outside (external differential quantumn efficiency) relevant to a flowing current (input power) is extremely improved.

In this example, As evaporated due to thermal treatment in hydrogen atmosphere because the window layer (top layer of the semiconductor laminating portion) was an AlGaAs based compound semiconductor layer. However, for example, in the case where InGaP is used as a window layer, heat treatment is carried out in the similar conditions, whereby P evaporates and a semi-insulating layer is formed similarly. In addition, a proton may be implanted instead of evaporating a part of constituent elements to cause insulation, thereby a current blocking layer can be formed similarly.

According to the semiconductor light emitting element of the present invention, a step is not formed on the surface of semiconductor laminating portion, and moreover, a current blocking layer is provided only at the lower side of the upper electrode. Therefore, the upper electrode is not released or scooped out due to a shock caused by wire bonding or the like, the reliability is extremely improved and external differential quantum efficiency is improved.

According to the production method of the present invention, there is no need to place the etching process in the middle of the epitaxial growth process, and the production process can be extremely simplified. In addition, there is no possibility that impurities are mixed in the vicinity of the light emitting layer forming portion, and a semiconductor light emitting device with its excellent optical properties is obtained.

Although preferred examples have been described in some detail it is to be understood that certain changes can be made by those skilled in the art without departing from the spirit and scope of the invention as defined by the appended claims.

What is claimed is:

1. A semiconductor light emitting device comprising:

a semiconductor substrate;

a semiconductor laminating portion provided on said semiconductor substrate and including a light emitting layer forming portion having at least an n-type layer and a p-type layer and a window layer;

an upper electrode partially provided on said semiconductor laminating portion;

a lower electrode provided on a back surface of said semiconductor substrate; and a current blocking layer which is provided on a part of a surface of said semiconductor laminating portion beneath said upper electrode, wherein a surface of said current blocking layer and the surface of said semiconductor laminating portion are flat without a step, wherein said current blocking layer is formed of a high resistance layer caused by a crystalline defect of a semiconductor layer of the surface of said semiconductor laminating portion and wherein said semiconductor layer of the surface of said semiconductor laminating portion is made of AlGaAs or InGaP, and As or P of a part of said semiconductor layer is evaporated, whereby the crystalline defect partially occurs in said semiconductor layer and said current blocking layer is formed in the high resistance layer.

2. A method for manufacturing a semiconductor light emitting device of claim 1 comprising the steps of:

growing a semiconductor laminating portion including a light emitting layer forming portion having at least an n-type layer and a p-type layer and a window layer on a semiconductor substrate;

providing a mask layer on said semiconductor laminating portion;

etching said mask layer at a portion corresponding to a position, at which an upper electrode is formed, to expose a surface of said semiconductor laminating portion;

carrying out a heat treatment under a hydrogen atmosphere, thereby evaporating an element that constitutes a semiconductor layer of the surface of said semiconductor laminating portion exposed from said mask layer to produce a crystalline defect;

removing only said mask layer; and forming an upper electrode at a site at which said crystalline defect is produced on said semiconductor laminating portion surface in size greater than that of the site.

3. The method according to claim 2, wherein said evaporated element is an As of said semiconductor layer made of an AlGaAs or a P of said semiconductor layer made of an InGaP.

4. The method according to claim 2, wherein said mask layer is made of a semiconductor of which etching rate is different from that of said semiconductor layer of the surface of said semiconductor laminating portion surface.

5. The method according to claim 2, wherein said mask layer is an insulating film.

6. The semiconductor light emitting device according to claim 1, wherein said light emitting layer forming portion is made of InGaAlP based compound semiconductor.

7. The semiconductor light emitting device according to claim 1, wherein said light emitting layer forming portion is made of AlGaAs based compound semiconductor.

* * * * *